United States Patent
Kasai

(10) Patent No.: US 6,655,968 B2
(45) Date of Patent: *Dec. 2, 2003

(54) CIRCUIT HAVING BUS BARS AND JUNCTION BOX CONTAINING THE CIRCUIT

(75) Inventor: Koji Kasai, Yokkaichi (JP)

(73) Assignee: Sumitomo Wiring Systems, Ltd., Mei (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/946,613

(22) Filed: Sep. 6, 2001

(65) Prior Publication Data

US 2002/0030036 A1 Mar. 14, 2002

(30) Foreign Application Priority Data

Sep. 8, 2000 (JP) ........................................ 2000-273423

(51) Int. Cl.⁷ .............................................. H01R 12/00
(52) U.S. Cl. .................... 439/76.2; 439/949; 174/71 B
(58) Field of Search ................................ 439/76.2, 969, 439/212; 174/71 B, 70 B

(56) References Cited

U.S. PATENT DOCUMENTS

| | | | | |
|---|---|---|---|---|
| 3,592,993 A | * | 7/1971 | Bennett | 219/93 |
| 4,172,246 A | * | 10/1979 | Cuzzone | 337/191 |
| 6,164,732 A | * | 12/2000 | Tominaga et al. | |
| 6,325,640 B1 | * | 12/2001 | Kasai | 439/76.2 |

* cited by examiner

Primary Examiner—Khiem Nguyen
(74) Attorney, Agent, or Firm—Oliff & Berridge, PLC

(57) ABSTRACT

An electrical circuit for use in an electrical junction box of a vehicle, has two bus bars welded to each other at a weld. A first one of the bus bars is formed of a material having an electrical conductivity selected from (a) in the range of from about 10 to about 60% and (b) not less than about 60%, and the second of the two bus bars is formed of a material having an electrical conductivity of not less than about 60%. At least one of the bus bars is tin-plated and at the weld the bus bars are joined through a tin-plating layer. Appropriate selection of the bus bar material in view of current loads is achieved, and good welding results.

19 Claims, 7 Drawing Sheets

CIRCUIT HAVING BUS BARS AND JUNCTION BOX CONTAINING THE CIRCUIT

BACKGROUND OF THE INVENTION

1. Field of Invention

The present invention relates to an electrical circuit comprising bus bars, and to an electrical junction box having the circuit. The circuit and the junction box are applicable particularly in a vehicle.

2. Description of Related Art

Recently, rapid increase of the number of electrical and electronic component parts mounted on a vehicle has led to increase of the number of circuits to be accommodated in an electrical connection box and in particular a junction box for a vehicle. Thus, in forming branch circuits at high density, it is necessary to mount a large number of component parts in the junction box, which causes increase in number of manufacturing stages.

In a typical known junction box shown in FIG. 7, bus bars 5A–5D are overlaid one upon another between an upper case part 2 and a lower case part 3, with insulation plates 4A–4E interposed between them. The upper case 2 has connector sockets 2a, relay sockets 2b, and fuse sockets 2c on which in use connectors 6, relays 7, and fuses 8 are respectively mounted. Terminals of the connectors 6, the relays 7, and the fuses 8 are connected to terminals 5a projecting from the bus bars directly or through relaying terminals. The lower case part 3 also has connector sockets 3a to connect connectors to terminals projecting from the bus bars.

In the junction box 1, with the increase in the number of circuits, the area and the number of layers of the bus bars increase, and thus the junction box becomes large. In the case where the connector sockets, the relay sockets and the fuse sockets are mounted on both the upper and lower case parts, it is possible to make the area of the junction box smaller than in the case where these sockets are mounted on only the upper case part or the lower case part.

However, in the case where the sockets are mounted at vertically opposed positions of the upper and lower case parts, terminals bent from the bus bars abut or overlap on each other and thus cannot be moved or distributed. In this case, it is necessary to form terminals on bus bars of additional layers. The increase of number of the layers of the bus bars leads to the increase of the height of the junction box. That is, the junction box is necessarily large.

Further, the connectors, fuses and relays are connected to the bus bars disposed inside the junction box. Thus, when the specification of the connection between the internal circuit and the fuses as well as the relays is altered, it is necessary to alter the construction of the entire internal circuit. That is, the above-described junction box is incapable of easily permitting a circuit alteration.

It is possible to deal with the problem of the increase of the layers of the bus bars caused by the overlapping or abutting of the terminals formed on the bus bars, by separate disposition of the bus bars to be connected to the connectors, those to be connected to the fuses and those to be connected to the relays. Further, it is possible to make the junction box more easily adjustable to various kinds and grades of vehicles by separating the internal circuit of the junction box into a connector connection circuit, a relay connection circuit, and a fuse connection circuit serving as a connector module, a relay module, and a fuse module.

The overall required internal circuit can be constructed of bus bars of the connector module, the relay module, and the fuse module by joining them to each other. The bus bars can be joined to each other by welding together projections at the ends of bus bars by resistance welding or the like.

As the material for a bus bar circuit, mostly, tin-plated brass sheet having a thickness of 0.64 mm is used in consideration of favorable weldability and low cost. In connecting the bus bars to each other by resistance welding, it is possible to form a projection on a welding surface of one bus bar so that the two bus bars are welded to each other by projection welding which is a form of resistance welding. Thus it is conceivable to use tin-plated brass as the material for the bus bar of each module and connect the modules to each other by projection welding.

However, depending on the required specification of the junction box, a current value higher than a normal value (about 20 A) or a much higher current value (about 100 A) may be applied to the internal circuit of the junction box. In the case where the internal circuit to which high current should be applied is composed of bus bars made of a material having a low conductivity, the bus bars generate heat owing to the internal resistance of their material, when high current is applied. Consequently, the temperature inside the junction box rises, which leads to disadvantages. Brass, which is conventionally used as the material of the bus bar, has a conductivity less than 30%. Therefore, brass is unsuitable for a bus bar circuit to which an electric current having a value higher than the normal value should be applied. That is to say, a bus bar circuit made of brass is not reliable in its operation.

The generation of heat can be suppressed if a high-conductivity material is used for the bus bar. However, such a high-conductivity material generates little heat when power is applied during welding. Thus it is difficult to heat the high-conductivity material to a temperature necessary for melting when welding, so that sufficient welding strength is difficult to obtain. Therefore it is inappropriate to use such high-conductivity material for the bus bars when they are to be welded to each other.

SUMMARY OF THE INVENTION

It is an object of the present invention to provide a circuit, e.g. for an electrical junction box, containing bus bars in which the construction is particularly adapted to the current levels to be applied to the bus bars.

It is a further object to provide an electrical junction box containing bus bars, which can be of compact dimensions.

According to the present invention, there is provided an electrical circuit having two bus bars welded to each other at a weld, wherein a first one of the two bus bars is formed of a material having an electrical conductivity selected from (a) in the range of from about 10 to about 60% and (b) not less than about 60% and the second one of the two bus bars is formed of a material having an electrical conductivity of not less than about 60%, and wherein at least one of the bus bars is tin-plated and at the weld the bus bars are joined through a tin-plating layer.

In this specification, including the claims, electrical conductivity is expressed in %, according to IACS (IACS is the abbreviation for International Annealed Copper Standard, which relates the electrical conductivity of a metal or alloy to that of copper in percentage terms).

As described above, the bus bar circuit of the present invention in this aspect may be formed of a novel combination of materials welded to each other to allow the bus bar circuit to have performance complying with a specified current value required for the junction box. For example, in the case where a specified value of electric current to be applied to the junction box is higher than a normal value (e.g. about 20 A) but not higher than a high value (e.g. about 100 A), it is possible to form one bus bar of a material having a low conductivity and the other bus bar of a material having a high conductivity. In this case, it is possible to achieve a high conductivity of a part of the bus bar circuit and thus partly suppress the heat output in use due to electrical resistance, which allows reliability of the bus bar circuit to be secured. Further, because the low-conductivity material for one bus bar is inexpensive, it is possible to produce the bus bar circuit at a low cost by using the combination of the low-conductivity material and the high-conductivity material.

In the case where a specified value of electric current to be applied to the junction box is high, both bus bars welded together can be formed of high-conductivity materials. As described previously, it is difficult to secure a desired high degree of welding strength when high-conductivity material is used for one bus bar or both bus bars. But according to the present invention in this aspect, because at least one of the two bus bars is tin-plated, the electric resistance at the weld increases owing to the melting of the plated layer when electric current is passed to weld them to each other. It is believed that the melted tin may alloy with the materials of the bus bars at the weld, and that the alloyed portions adhere well to each other. Good weldability can be secured, and a desired degree of welding strength can be obtained. Tin-plating of both bus bars causes the electric resistance to increase more, which further improves the weldability.

In the case, for example, where a specified value of electric current to be applied to the junction box is not less than about 20 A nor more than about 100 A, as a preferable combination of bus bar materials it is possible to use tin-plated brass as the material for one bus bar and any one of a tin-plated copper alloy, copper alloy not tin-plated, tin-plated oxygen-free copper, and oxygen-free copper not tin-plated as the material for the other bus bar. As another suitable combination, it is possible to form one bus bar of brass not tin-plated and the other bus bar of the tin-plated copper alloy or the tin-plated oxygen-free copper.

Brass is a low-conductivity material having a conductivity lower than 30%. On the other hand, copper alloy is a high-conductivity material having a conductivity of typically about 60%. Oxygen-free copper is also a high-conductivity material having a conductivity of typically about 100%. Within the present invention, as described above, one bus bar may be formed of the low-conductivity brass and the other bus bar may be formed of the high-conductivity copper alloy or the oxygen-free copper, and at least one of the bus bars may be tin-plated to secure a favorable degree of weldability. In this manner, it is possible to form a bus bar circuit which satisfies the specification for the junction box and is inexpensive.

In the case where a specified value of electric current to be applied to the junction box is high, as a preferable combination of bus bar materials, one bus bar may be formed of a tin-plated copper alloy or tin-plated oxygen-free copper, and the other bus bar may be formed of any one of a tin-plated copper alloy, a copper alloy not tin-plated, tin-plated oxygen-free copper, and oxygen-free copper not tin-plated. Even though the high-conductivity materials are used for both bus bars, at least one of both bus bars is tin-plated. Thus, it is possible to obtain a desired degree of weldability and satisfy the specification for the junction box.

It is possible to improve weldability even further when both bus bars are tin-plated, at least at the welding zone.

According to the present invention in a second aspect, there is provided an electrical circuit having two bus bars welded to each other at a weld, wherein a first one of the two bus bars is formed of brass without tin-plating and the second one of the two bus bars is formed of a material selected from tin-plated brass and brass without tin-plating.

In the case where a specified value of electric current to be applied to the junction box is a normal current value (e.g. about 20 A), brass having a low conductivity can be used as the material for both bus bars to be welded to each other. Because the brass has a high internal resistance, it is heated to a temperature necessary for melting it when current is applied in welding. Thus, it is possible to secure a desired degree of welding strength without tin-plating one bus bar or both bus bars. Accordingly, cost is reduced since the manufacturing cost of bus bars made of the brass not tin-plated is less than that of bus bars made of tin-plated brass.

The bus bars are preferably welded to each other by resistance welding. Owing to the use of the resistance welding, it is possible to improve production efficiency in the welding process and stabilize welding quality. Alternatively, ultrasonic welding, gas welding and/or laser welding may be used.

A projection may be formed on a welding surface of one of the two bus bars to be welded to each other by resistance welding. The projection allows a welding force and electric current to concentrate at the contact portion of the projection, thus increasing the weldability. In addition, the projection enhances the welding strength in synergism with tin-plating. In the case where the projection is formed on one bus bar having a higher hardness than the other bus bar, they can be welded to each other. To obtain a high degree of welding strength, it is favorable to form the projection on the other bus bar having a lower hardness, because the projection can be smoothed away in the projection welding.

According to the invention in a further aspect, the above circuits of the invention, in particular the materials selected for the welded bus bars, are applied to an electrical junction box for a vehicle having a casing and mounted within the casing a first circuit module adapted to be connected to at least one electrical connector in use of said electrical junction box and a second circuit module selected from (i) a fuse module adapted to be connected to electrical fuses in use of the electrical junction box, (ii) a relay module adapted to be connected to electrical relays in use of the electrical junction box, and (iii) a combined fuse and relay module adapted to be connected to electrical fuses and electrical relays in use of the electrical junction box, each of the first and second circuit modules having at least one bus bar and an insulating body carrying the at least one bus bar, two of the bus bars, respectively on the first and second circuit modules, being welded to each other at a weld to form electrical connection between the first and second circuit modules.

Conventionally, in an electrical junction box for a vehicle, one conductive plate is punched to form the connector circuit, the fuse circuit, and the relay circuit, and connector tabs, fuse tabs, and relay tabs are provided on the connector circuit, the fuse circuit, and the relay circuit respectively. Thus, disposition and handling of the circuits are complicated. Consequently, the bus bars occupy a wide area and are multi-layered.

On the other hand, with the electrical junction box of the present invention, the connector connection bus bar, the fuse connection bus bar, and the relay connection bus bar may be formed by punching separate conductive plates and are disposed at separate positions. Therefore, it is possible to reduce layering of the bus bars and it is easy to dispose and handle the circuits. Thus it is possible to reduce the area and/or volume of the bus bars. In joining the bus bars of each module by welding them to each other, the bus bars made of the above-described materials are combined with each other to form various bus bar circuits, according to specified values of electric current to be applied to the junction box.

The invention further includes a vehicle having the electrical junction box mounted in it.

BRIEF DESCRIPTION OF THE DRAWINGS

Embodiments of the present invention will now be described by way of non-limitative example with reference to the accompanying drawings, in which:

FIGS. 5A–5C show a second bus bar circuit to which the present invention is applied, in which FIG. 5A is a plan view of a circuit plate, FIG. 5B is a sectional view on line A—A of FIG. 5A, and FIG. 5C is an enlarged view of a portion of FIG. 5B;

DETAILED DESCRIPTION OF PREFERRED EMBODIMENTS

Figure 1:
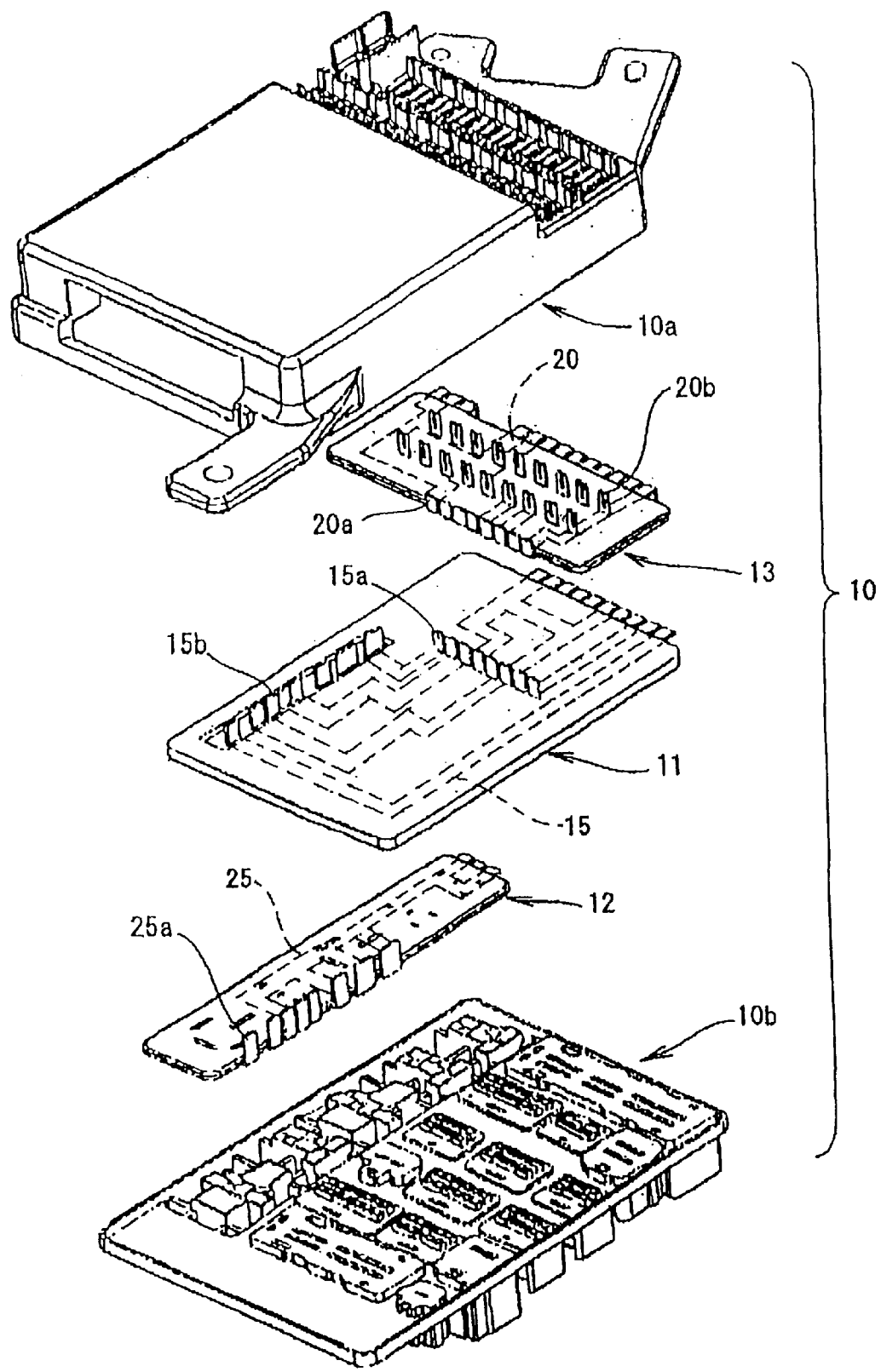
FIG. 1 is a schematic exploded perspective view of a junction box having a plurality of modules, to which the present invention is applied.

FIG. 1 is an exploded perspective view showing a junction box 10 incorporating the invention as a first embodiment. The junction box 10 has a connector module 11, a fuse module 13 and a relay module 12, each comprising bus bars mounted on or between insulation plates, so that the internal circuit of the junction box 10 in the upper case part 10a and lower case part 10b is separated into a connector connection circuit, a fuse connection circuit and a relay connection circuit.

In each module, the ends of bus bars fixed on an insulation plate or plates project from the vicinity of the insulation plates to form welding portions, and welding portions of different modules are connected to each other to form a required bus bar circuit. For example, welding portions 15a projecting from the connector module 11 may be overlaid on welding portions 20a of the fuse module 13 and welded to connect the connector module 11 and the fuse module 13 to each other. In this manner, the required bus bar circuit is formed. Similarly, welding portions 15b projecting from the connector module 11 may be overlaid on welding portions 25a of the relay module 12 and welded to connect the connector module 11 and the relay module 12 to each other.

For a fuller explanation of the junction box of FIG. 1, reference should be made to co-pending U.S. patent application Ser. No. 09/833,595), which is incorporated herein by reference in its entirety.

According to the specification of the junction box 10, high current of about 100 A is supplied to the internal circuit thereof. Thus, to comply with the need for application of this high current, a material having a high conductivity is used for at least some of the bus bars of the modules constructing the internal circuit. More specifically, bus bars 15 of the connector module 11 may be formed of tin-plated oxygen-free copper having a thickness of about 0.64 mm; bus bars 20 of the fuse module 13 may be formed of a tin-plated copper alloy having a thickness of about 0.64 mm; and bus bars 25 of the relay module 12 may be formed of oxygen-free copper not tin-plated and having a thickness of about 0.64 mm.

The conductivity of the oxygen-free copper is about 100%. The conductivity of the copper alloy is about 60%. That is, both are conductive materials each having a high conductivity. The oxygen-free copper has a lower hardness than the copper alloy.

Figure 2:
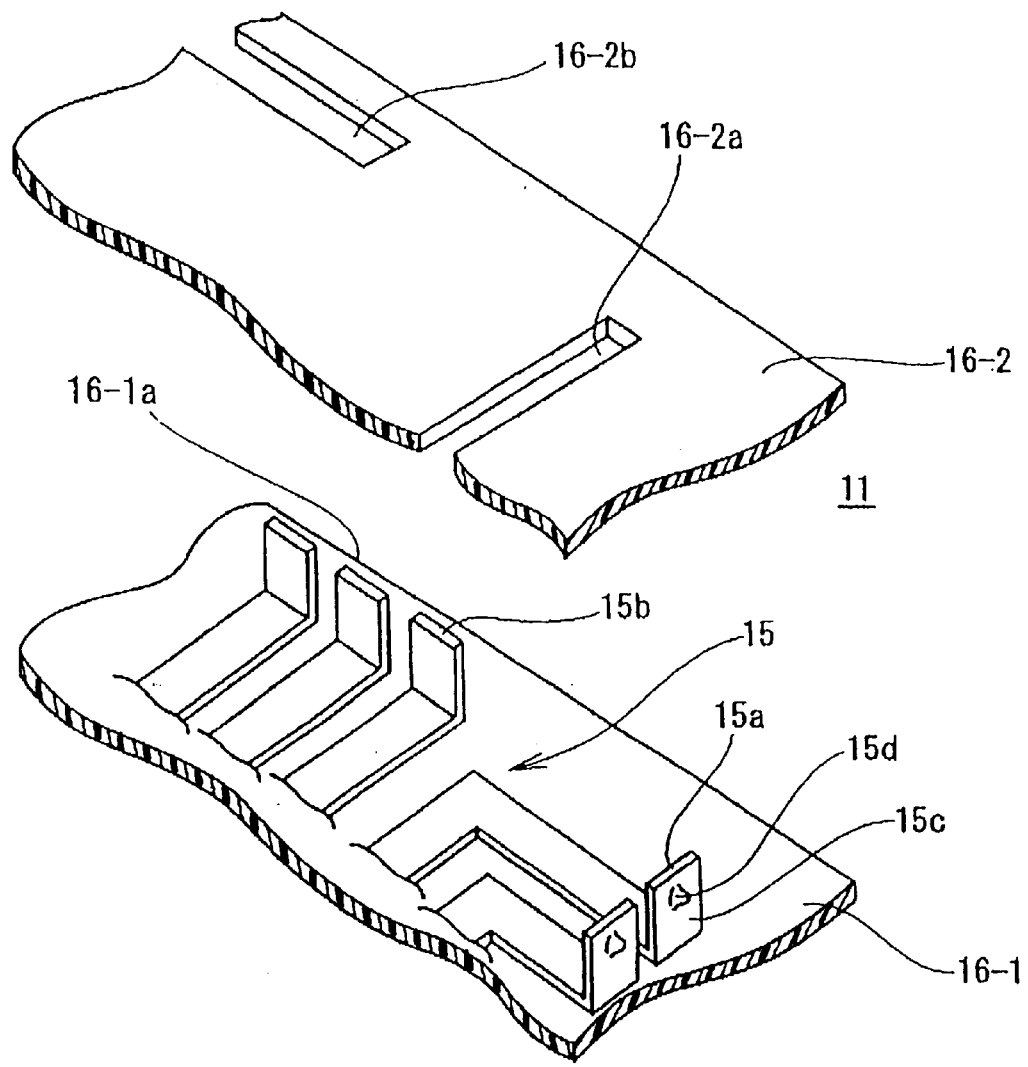
FIG. 2 is an exploded perspective partial view of a connector module of the box of FIG. 1.

As shown in FIG. 2, in the connector module 11, the bus bars 15 are formed by punching a conductive plate made of the tin-plated oxygen-free copper in the shape of a circuit. The bus bars may be disposed on an insulation plate 16-1, and an insulation plate having through-holes 16-2a and 16-2b may be overlaid on the insulation plate 16-1.

The welding portions 15a are formed in the vicinity of an interior portion of the insulation plate 16-1 by bending ends of the bus bars 15 into an L-shape. At the vertical welding surface 15c of each welding portion 15a, a projection 15d may be formed. In the vicinity of one edge 16-1a of the insulation plate 16-1, ends of the bus bars 15 are bent into an L-shape to form the welding portions 15b. The insulation plate 16-2 may be overlaid on the bus bars 15. As a result, the welding portions 15a and 15b penetrate upward through the through-holes 16-2a and 16-2b respectively.

The relay module 12 has a construction similar to that of the connector module 11, although the circuit configuration of the relay module 12 is different. The bus bars 25 may be overlaid and fixed on an insulation plate. Ends of the bus bars 25 projecting from the periphery of the insulation plate may be bent into an L-shape to form the welding portions 25a. Similarly to the relay module 12, in the fuse module 13, ends of the bus bars 20 overlaid and fixed on an insulation plate may be bent up to form the welding portion 20a. The fuse connection tabs 20b may be formed by bending up portions of the bus bars 20, where the fuses are to be inserted.

The modules may be joined to each other to form the internal circuit of the junction box. In the embodiment, the modules are joined to each other by a resistance welding process such as projection welding or spot welding.

Figure 3A:
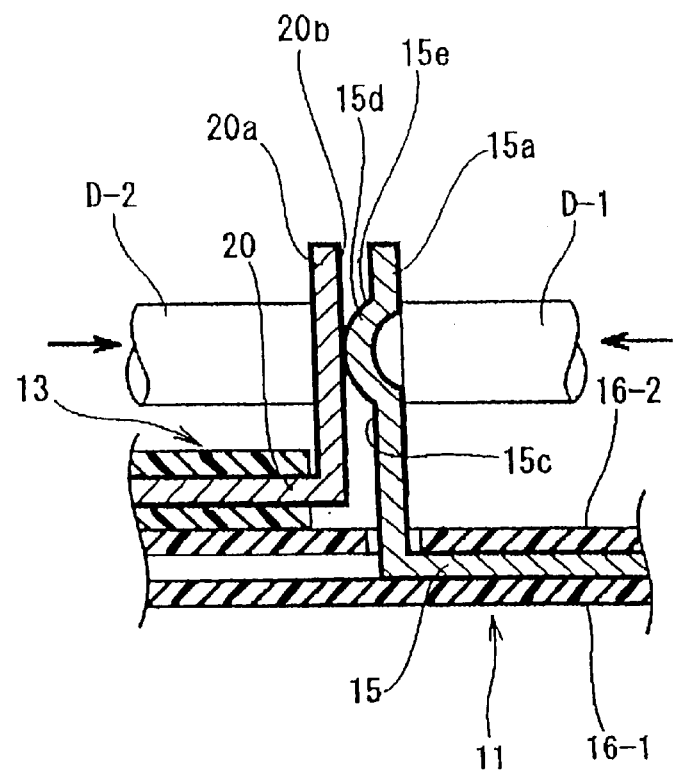
FIGS. 3A and 3B are schematic views of projection welding of bus bars in the box of FIG. 1.
Figure 3B:
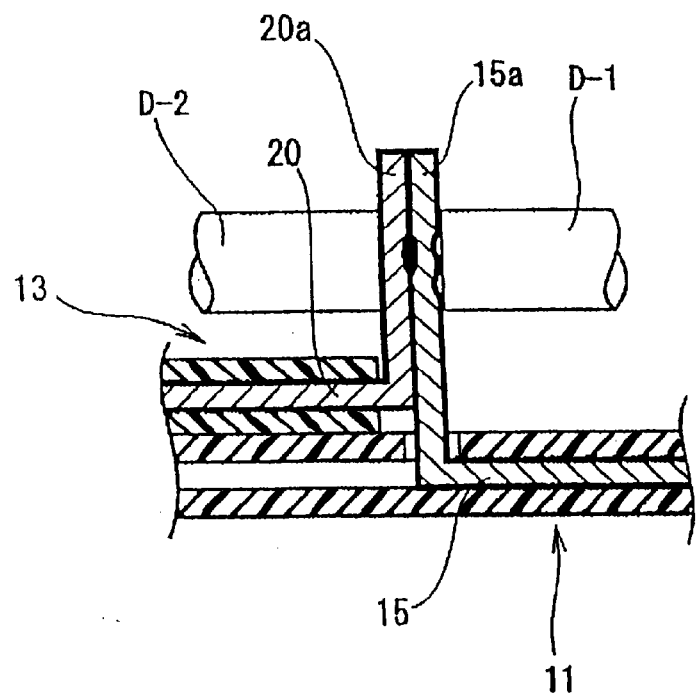

FIGS. 3A and 3B show a state in which the welding portions 15a and 20a are welded to each other by projection welding to join the connector module 11 and the fuse module 13 to each other. The welding surface of the projection 15d of the connector module welding portion 15a is disposed in contact with the welding surface of the fuse module welding portion 20a through tin-plated layers 15e and 20b (shown by bold lines). In this state, the welding portions 15a and 20a are pressed together, sandwiched between, for example, energized welding electrodes D-1 and D-2. By the applied load, the top portion of the projection 15d is pressed against the contact surface of the welding portion 20a. Current flows through the contact portion, which generates heat. Consequently the tin-plated layer 15e of the bus bar 15 and the tin-plated layer 20b of the bus bar 20 melt. As a result, the electric resistance at the contact portion increases, and the heat generated increases much. Because the welding portions 15a and 20a are pressurized continuously in this state, the projection 15d is crushed because its strength is reduced by the heat generated. In this manner, the welding portions 15a and 20a are welded to each other. In the first embodiment, because the welding portion 15a has a lower hardness than the welding portion 20a, the projection 15d is smoothly crushed. Further, the heat generated increases owing to the melting of the tin-plated layer. Therefore, the materials both having a high conductivity can be welded to each other firmly.

Figure 4A:
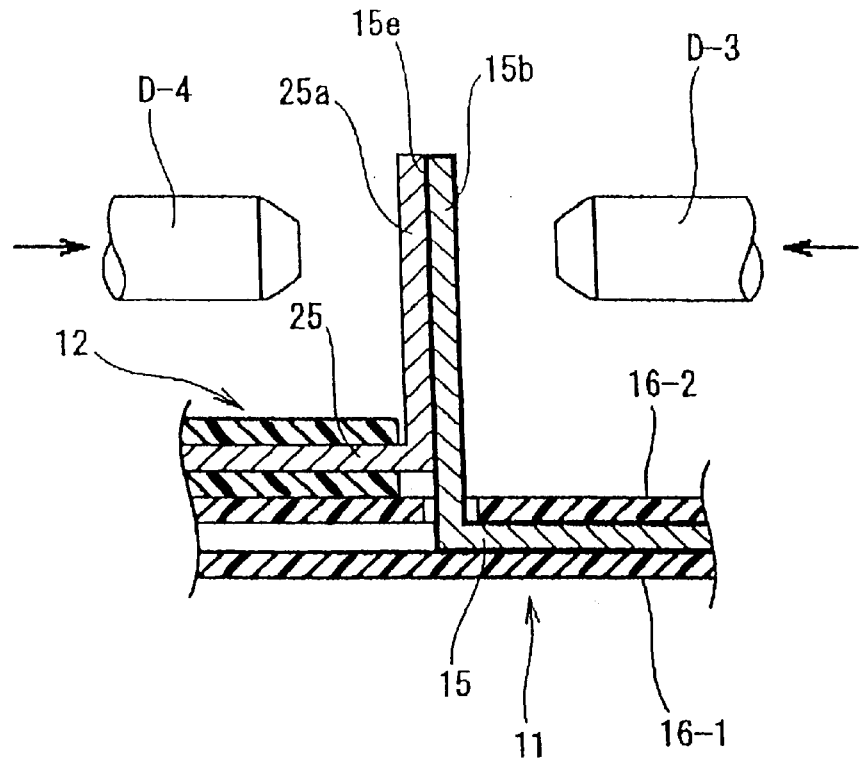
FIGS. 4A and 4B are schematic views of spot welding of the bus bars of FIG. 1.
Figure 4B:
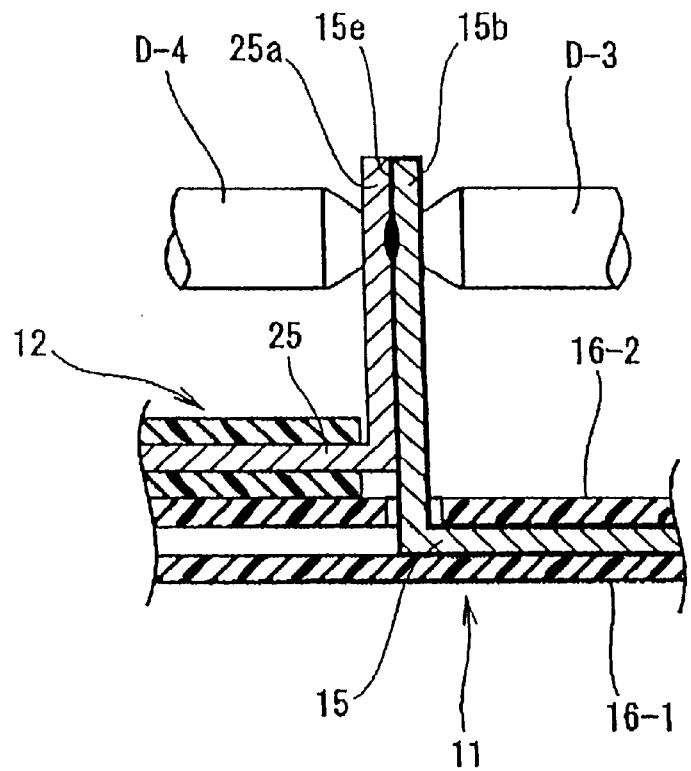

FIGS. 4A and 4B show a state in which the welding portions 15b and 25a are welded to each other by spot welding to join the connector module 11 and the relay module 12 to each other. The welding surface of the connector module welding portion 15b is disposed in contact with the welding surface of the relay module welding portion 25a. In this state, the welding portions 15b and 25a are sandwiched between, for example, energized welding electrodes D-3 and D-4 which apply pressure. Due to the pressure load and heat generation owing to the internal resistance on the application of electric current, the tin-plated layer 15e of the welding portion 15b melts and the heat output increases. Thus the welding portions 15b and 25a are welded to each other firmly. By such welding, the circuits of the connector module 11, the relay module 12 and the fuse module 13 are electrically conductive to each other, thus forming the bus bar circuit of the junction box 10 to which a high electric current may be safely applied.

The material for the bus bar of each module to which high current can be applied is not limited to that of the first embodiment. For example, the bus bar circuit welds may be formed by forming one bus bar of a tin-plated copper alloy and the other bus bar of any one of the tin-plated copper alloy, a copper alloy not tinplated, and oxygen-free copper not tin-plated and welding them to each other. It is also possible to form one bus bar of tin-plated oxygen-free copper and the other of the copper alloy not tin-plated or the tin-plated oxygen-free copper and weld them to each other.

In the case where the value of electric current to be applied to the junction box is specified as being high, the most favorable combination of the above-described combinations is the combination of bus bars made of oxygen-free copper having a conductivity of about 100%. The second most favorable combination is the combination of a bus bar made of oxygen-free copper and a bus bar made of copper alloy. The third most favorable combination is the combination of bus bars made of the copper alloy. An optimum combination of materials is selected in consideration of the value of electric current to be applied to the junction box and cost. Because at least one of bus bars is tin-plated, the tin melts owing to heat generated by the welding and thus the welding can be accomplished reliably. It is possible to improve the weldability to a higher extent in the case where both are tin-plated.

In the case where the value of electric current to be applied to the junction box is specified at not less than 20 A and not more than 100 A, it is possible to use tin-plated brass having a low conductivity as the material for one bus bar and a material having a high conductivity, namely, any one of the tin-plated copper alloy, the copper alloy not tin-plated, tin-plated oxygen-free copper, and oxygen-free copper not tin-plated as the material for the other bus bar. As another combination, it is possible to form one bus bar of brass not tin-plated and the other bus bar of the tinplated copper alloy or the tin-plated oxygen-free copper.

In the case where the bus bar circuit is formed of the low-conductivity material and the high-conductivity material, it is possible to apply high electric current to a part of the bus bar circuit. Thus, the above-described combination of materials is preferable for the internal circuit of the junction box to which electric current having an intermediate value is applied. The weldability of the combination of a material having a low conductivity and a material having a high conductivity is more favorable than the weldability of a combination of materials both having a high conductivity. Further, the welding of the combination of the material having a low conductivity and the material having a high conductivity is less expensive than the welding of the combination of the materials both having a high conductivity. Furthermore, because at least one of the low-conductivity material and the high-conductivity material is tin-plated, it is possible to secure a necessary degree of welding strength.

In the case where the value of electric current to be applied to the junction box is specified at a normal current value of about 20 A, it is unnecessary to use the above-described high-conductivity material for the bus bar of each module. In this case, it is possible to construct the bus bar circuit by welding one bus bar made of tin-plated brass and the other bus bar made of brass not tin-plated to each other or bus bars made of brass not tin-plated to each other. Because brass which is a material having a low conductivity has a high internal resistance and is thus superior in weldability, both materials made of brass not tin-plated can be welded to each other.

In the case where bus bar materials of the above-described combinations are welded by projection welding, it is preferable to form the projection on the welding surface of a material of lower hardness to allow the projection to be crushed smoothly. For example, in the case of brass and copper alloy, the projection is preferably formed on the brass. It is alternatively possible to form the projection on a material of higher hardness. Even spot welding can be used to secure a sufficient degree of welding strength in welding between bus bars made of brass having a low conductivity. That is, in this case, projection welding is unnecessary. Instead of resistance welding such as the projection welding and the spot welding, ultrasonic welding, gas welding or laser welding may be used.

Figure 5A:
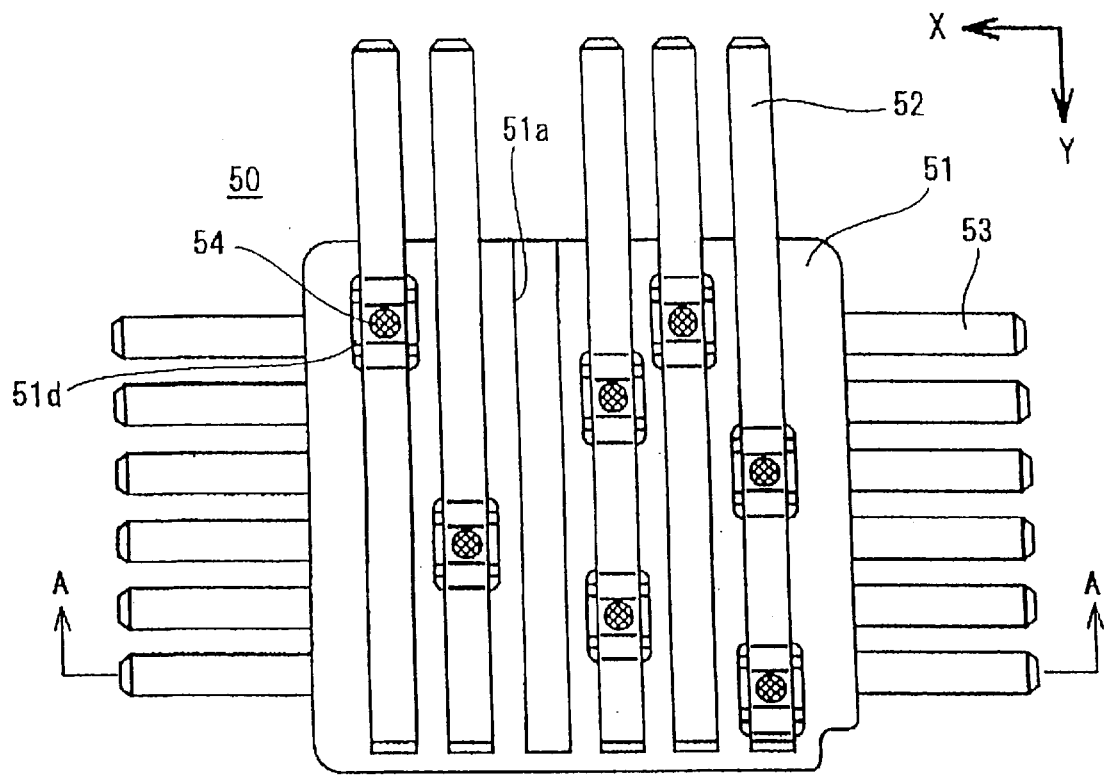
Figure 5B:
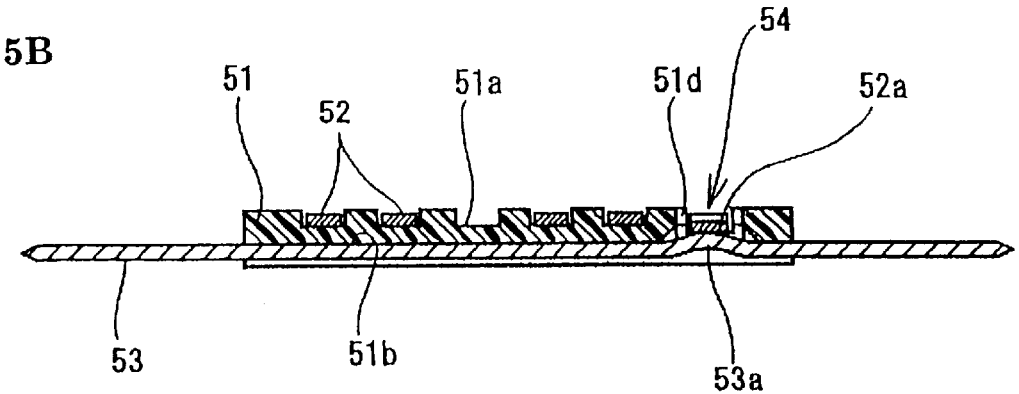
Figure 5C:
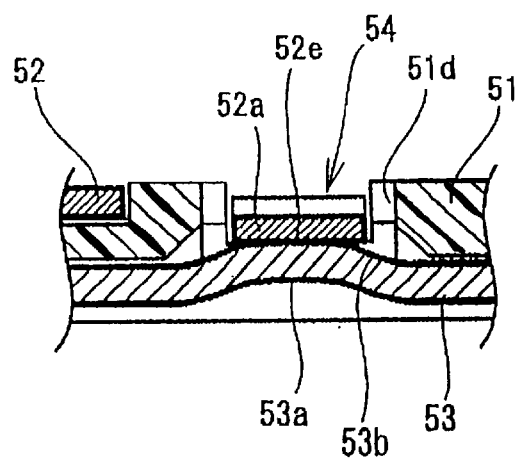

FIGS. 5A, 5B, and 5C show a circuit plate 50 including bus bars, to which the invention is applied as a second embodiment. The circuit 50 is described in detail in co-pending U.S. patent application Ser. No. 09/758,389, which is incorporated herein by reference in its entirety. A plurality of long and narrow bus bars 52 are arranged on the upper surface of an insulation plate 51 parallel to one another in an X-direction. A plurality of long and narrow bus bars 53 are also arranged on the lower surface of the insulation plate 51 parallel to one another in a Y-direction orthogonal to the X-direction. To locate the bus bars 52 and 53 on the upper and lower surfaces of the insulation plate 51, a plurality of grooves 51a and 51b are formed on the upper and lower surfaces of the insulation plate 51 respectively. Through-holes 51d are formed in the insulation plate 51 at positions where electrical connection between the upper and lower bus bars 52 and 53 is desired.

Because high current is applied to the circuit plate 50, tin-plated copper alloy may be used to form the bus bars 52, whereas tin-plated oxygen-free copper may be used to form the bus bars 53. At the position of the insulation plate 51 corresponding to the through-hole 51d, to bring the bus bars 52 and 53 into contact with each other, the bus bar 52 is bent downward to form a bent portion 52a, whereas the bus bar 53 is bent upward to form a bent portion 53a.

The bus bars 52 and 53 may be joined to each other by spot welding. The bus bars 52 and 53 are brought into contact with each other through the tin-plated layers 52e and 53b. The contact portions of the bus bars 52 and 53 may be sandwiched vertically between energized electrodes and pressed together to form a continuity contact portion 54. In the welding operation, the tin melts because the continuity contact portion 54 generates heat owing to its internal resistance by the application of electric current. Thus the copper alloy and the oxygen-free copper can be welded to each other firmly, even though the weldability thereof is otherwise regarded as unfavorable.

Figure 6:
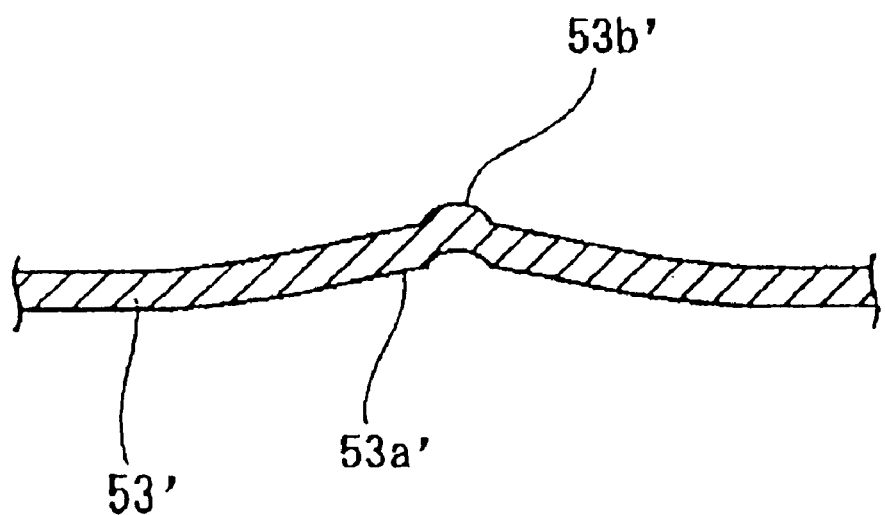
FIG. 6 is a schematic view showing a bus bar in a modification of the embodiment of FIGS. 5A–5C.
Figure 7:
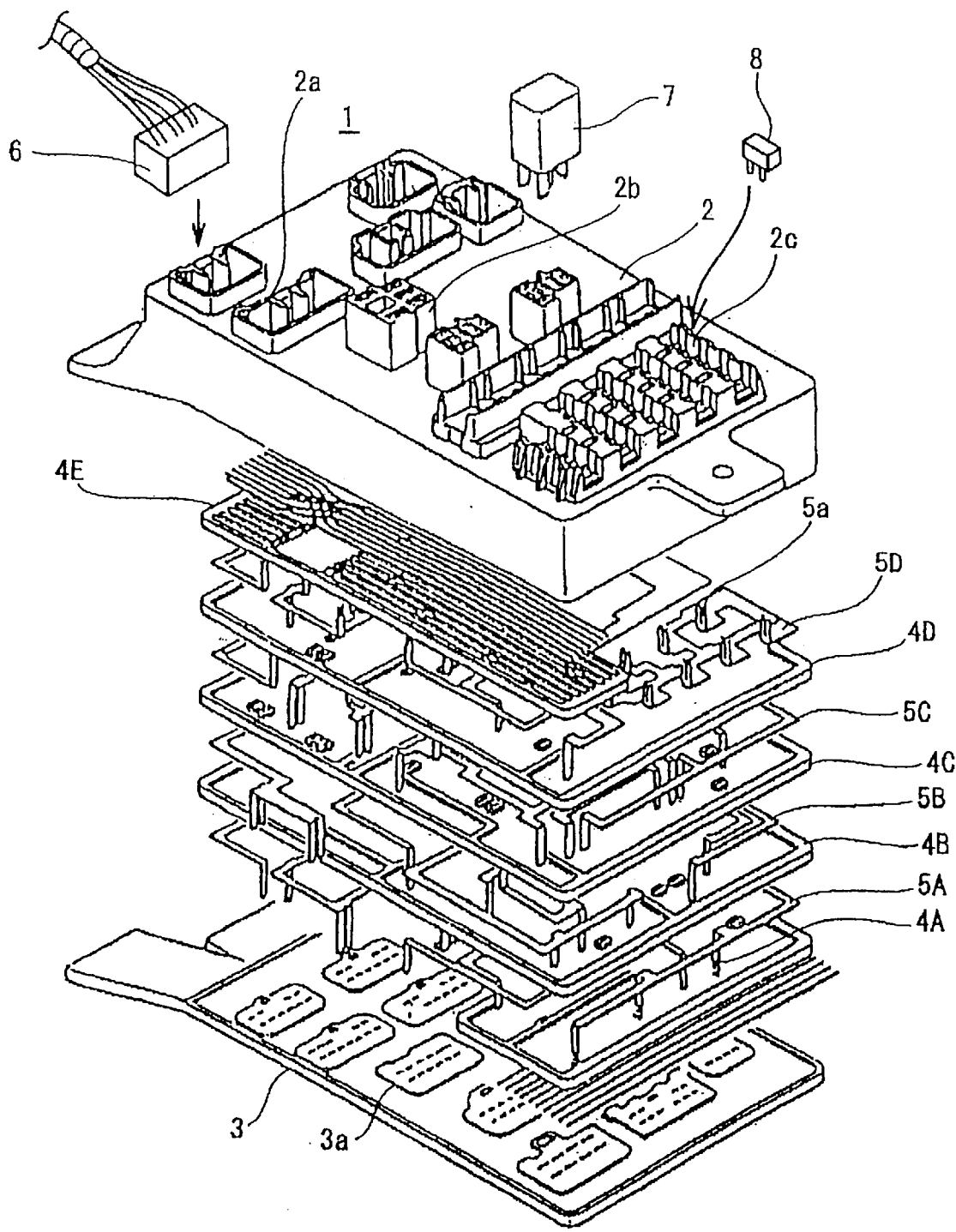
FIG. 7 is an exploded perspective view showing a conventional junction box, described above.

The bus bars 52 and 53 may alternatively be welded to each other by projection welding. In this case, as shown in FIG. 6, a projection 53b is formed on a bent portion 53a of a bus bar 53 made of the lower-conductivity oxygen-free copper to facilitate the welding.

The combination of materials for the bus bars 52 and 53 is not limited to that described above, but the combinations used for application of high current in the first embodiment are applicable in the second embodiment. In the case where electric current having an intermediate value or a normal value (about 20 A) is applied to the circuit plate 50, the combinations used in the first embodiment are applicable in the second embodiment. It is not necessary to use the same kind of material for all of the long and narrow upper bus bars 52, but it is possible to use a different material for each bus bar 52. Similarly, it is possible to use a different material for each bus bar 53. As in the first embodiment, ultrasonic welding, gas welding or laser welding may also be used.

As is apparent from the foregoing description, using the bus bar circuit of the present invention, it is possible to weld materials which are difficult to join to each other by conventional joining methods. Thus it is possible to form the internal circuit of the junction box by combining materials optimum for a specified value of electric current to be applied to the junction box. Upon application of electric current to the internal circuit, the internal circuit does not give rise to deficiencies in spite of heat generated in the bus bars. Therefore, reliable internal circuit can be obtained. In addition, the bus bar circuit can be produced at a low cost in the case where materials are not tin-plated are used in the combination of materials. Accordingly, it is possible to enhance both performance and cost.

Further, it is possible to prevent the junction box from becoming large and comply with alteration of the construction of circuits by separating the internal circuit of the junction box into the connector module, the fuse module and the relay module for each electric component part.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

What is claimed is:

1. An electrical circuit having two bus bars welded to each other at a weld, wherein a first one of said two bus bars is formed of a material having an electrical conductivity selected from (a) in the range of from about 10 to about 60% and (b) not less than about 60% and the second of said two bus bars is formed of a material having an electrical conductivity of not less than about 60%, and wherein at least one of said bus bars is tin-plated and at said weld said bus bars are joined through a tin-plating layer.

2. An electrical circuit according to claim 1, wherein said material of said first bus bar is tin-plated brass and said material of said second bus bar is selected from tin-plated copper alloy, copper alloy without tin-plating, tin-plated oxygen-free copper and oxygen-free copper without tin-plating.

3. An electrical circuit according to claim 1, wherein said material of said first bus bar is brass without tin-plating and said material of said second bus bar is selected from tin-plated copper alloy and tin-plated oxygen-free copper.

4. An electrical circuit according to claim 1, wherein said material of said first bus bar is selected from tin-plated copper alloy and tin-plated oxygen-free copper and said material of said second bus bar is selected from tin-plated copper alloy, copper alloy without tin-plating, tin-plated oxygen-free copper and oxygen-free copper without tin-plating.

5. An electrical circuit according to claim 1, wherein said material of each said bus bar is in one-piece sheet form and said electrical circuit comprises first and second insulating bodies respectively carrying said first and second bus bars, said first and second bus bars having respective tab portions projecting from said respective insulating bodies and welded together at said weld.

6. An electrical circuit according to claim 1, wherein said bus bars are welded to each other by resistance welding.

7. An electrical circuit according to claim 6, wherein one of said bus bars has, prior to resistance welding, a projection on a surface thereof which is directed towards the other of said bus bars in said weld.

8. An electrical junction box containing an electrical circuit having two bus bars welded to each other at a weld, wherein a first one of said two bus bars is formed of a material having an electrical conductivity selected from (a) in the range of from about 10 to about 60% and (b) not less than about 60% and the second of said two bus bars is formed of a material having an electrical conductivity of not less than about 60%, and wherein at least one of said bus bars is tin-plated and at said weld said bus bars are joined through a tin-plating layer.

9. An electrical junction box according to claim 8, wherein said material of each said bus bar is in one-piece sheet form and said electrical circuit comprises first and second insulating bodies respectively carrying said first and second bus bars, said first and second bus bars having respective tab portions projecting from said respective insulating bodies and welded together at said weld.

10. A vehicle in which is mounted an electrical junction box according to claim 8.

11. An electrical circuit having two bus bars welded to each other at a weld, wherein a first one of said two bus bars is formed of brass, having an electrical conductivity less than 30%, without tin-plating and the second one of said two bus bars is formed of a material selected from tin-plated brass and brass without tin-plating, and an electrical current value of about 20 A is applied.

12. An electrical circuit according to claim 11, wherein said material of each said bus bar is in one-piece sheet form and said electrical circuit comprises first and second insulating bodies respectively carrying said first and second bus bars, said first and second bus bars having respective tab portions projecting from said respective insulating bodies and welded together at said weld.

13. An electrical circuit according to claim 11, wherein said bus bars are welded to each other by resistance welding.

14. An electrical circuit according to claim 13, wherein one of said bus bars has, prior to resistance welding, a projection on a surface thereof which is directed towards the other of said bus bars in said weld.

15. An electrical junction box containing an electrical circuit having two bus bars welded to each other at a weld, wherein a first one of said two bus bars is formed of brass, having an electrical conductivity less than 30%, without tin-plating and the second one of said two bus bars is formed of a material selected from tin-plated brass and brass without tin-plating, and an electrical current value of about 20 A is applied.

16. An electrical junction box according to claim 15, wherein said material of each said bus bar is in one-piece sheet form and said electrical circuit comprises first and second insulating bodies respectively carrying said first and second bus bars, said first and second bus bars having respective tab portions projecting from said respective insulating bodies and welded together at said weld.

17. A vehicle in which is mounted an electrical junction box according to claim 15.

18. An electrical junction box for a vehicle having a casing and mounted within said casing a first circuit module adapted to be connected to at least one electrical connector in use of said electrical junction box and a second circuit module selected from (i) a fuse module adapted to be connected to electrical fuses in use of said electrical junction box, (ii) a relay module adapted to be connected to electrical relays in use of said electrical junction box, and (iii) a combined fuse and relay module adapted to be connected to electrical fuses and electrical relays in use of said electrical junction box, each of said first and second circuit modules having at least one bus bar and an insulating body carrying said at least one bus bar, two of said bus bars, respectively on first and second circuit modules, being welded to each other at a weld to form electrical connection between said first and second circuit modules, wherein a first one of said two bus bars is formed of a material having an electrical conductivity selected from (a) in the range of from about 10 to about 60% and (b) not less than about 60% and the second of said two bus bars is formed of a material having an electrical conductivity of not less than about 60%, and wherein at least one of said bus bars is tin-plated and at said weld said bus bars are joined through a tin-plating layer.

19. An electrical junction box for a vehicle having a casing and mounted within said casing a first circuit module adapted to be connected to at least one electrical connector in use of said electrical junction box and a second circuit module selected from (i) a fuse module adapted to be connected to electrical fuses in use of said electrical junction box, (ii) a relay module adapted to be connected to electrical relays in use of said electrical junction box, and (iii) a combined fuse and relay module adapted to be connected to electrical fuses and electrical relays in use of said electrical junction box, each of said first and second circuit modules having at least one bus bar and an insulating body carrying said at least one bus bar, two of said bus bars, respectively on first and second circuit modules, being welded to each other at a weld to form electrical connection between said first and second circuit modules, wherein a first one of said two bus bars is formed of brass, having an electrical conductivity less than 30%, without tin-plating and the second one of said two bus bars is formed of a material selected from tin-plated brass and brass without tin-plating, and an electrical current value of about 20 A is applied.

* * * * *